US009029253B2

(12) United States Patent
Milligan et al.

(10) Patent No.: US 9,029,253 B2
(45) Date of Patent: May 12, 2015

(54) PHASE-STABILIZED THIN FILMS, STRUCTURES AND DEVICES INCLUDING THE THIN FILMS, AND METHODS OF FORMING SAME (71) Applicant: ASM IP Holding B.V., Almere (NL)

(72) Inventors: Robert Brennan Milligan, Gold Canyon, AZ (US); Fred Alokozai, Scottsdale, AZ (US)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/874,708

(22) Filed: May 1, 2013

(65) Prior Publication Data

US 2013/0292676 A1 Nov. 7, 2013

Related U.S. Application Data (60) Provisional application No. 61/641,602, filed on May 2, 2012.

(51) Int. Cl.
*H01L 21/20* (2006.01)
*H01L 29/49* (2006.01)
*H01L 29/40* (2006.01)
*H01L 21/28* (2006.01)

(Continued)

(52) U.S. Cl.
CPC .......... *H01L 29/4908* (2013.01); *H01L 29/401* (2013.01); *H01L 21/28088* (2013.01); *H01L 29/4966* (2013.01); *H01L 29/517* (2013.01); *H01L 21/67167* (2013.01); *H01L 21/67253* (2013.01)

(58) Field of Classification Search
CPC .............. H01L 29/4908; H01L 29/401; H01L 21/28088; H01L 29/4966; H01L 29/517; H01L 21/67167; H01L 21/67253
USPC .......... 257/E21.292, 202, 392, 407, 412, 388, 257/E51.006, E27.06; 438/584, 585, 680, 438/683, 685
See application file for complete search history.

(56) References Cited

U.S. PATENT DOCUMENTS 2,745,640 A    5/1956    Cushman
2,990,045 A    9/1959    Root (Continued)

FOREIGN PATENT DOCUMENTS

CN    1563483       1/2005
CN    101330015     12/2008

(Continued)

OTHER PUBLICATIONS

Koutsokeras et al. Texture and microstructure evolution in single-phase TixTa1-xN alloys of rocksalt structure. Journal of Applied Physics 110, 2011, pp. 043535-1-043535-6.*

(Continued)

*Primary Examiner* — Galina Yushina
(74) *Attorney, Agent, or Firm* — Snell & Wilmer LLP (57) ABSTRACT Nitrogen-containing phase-stabilized films, methods of forming phase-stabilized films, and structures and devices including the phase-stabilized films are disclosed. The phase-stabilized films include a matrix material and a phase stabilizer, which provides a morphologically stabilizing effect to a matrix material within the films. The phase-stabilized films may be used as, for example, gate electrodes and similar films in microelectronic devices.

11 Claims, 5 Drawing Sheets (51) Int. Cl.
    *H01L 21/44* (2006.01)
    *H01L 29/51* (2006.01)
    *H01L 21/67* (2006.01)

(56) References Cited

U.S. PATENT DOCUMENTS

| | | | |
|---|---|---|---|
| 3,833,492 A | 9/1974 | Bollyky | |
| 3,854,443 A | 12/1974 | Baerg | |
| 3,862,397 A | 1/1975 | Anderson et al. | |
| 3,887,790 A | 6/1975 | Ferguson | |
| 4,058,430 A | 11/1977 | Suntola et al. | |
| 4,176,630 A | 12/1979 | Elmer | |
| 4,194,536 A | 3/1980 | Stine et al. | |
| 4,389,973 A | 6/1983 | Suntola et al. | |
| 4,393,013 A | 7/1983 | McMenamin | |
| 4,436,674 A | 3/1984 | McMenamin | |
| 4,570,328 A | 2/1986 | Price et al. | |
| 4,653,541 A | 3/1987 | Oehlschlaeger et al. | |
| 4,722,298 A | 2/1988 | Rubin et al. | |
| 4,735,259 A | 4/1988 | Vincent | |
| 4,753,192 A | 6/1988 | Goldsmith et al. | |
| 4,789,294 A | 12/1988 | Sato et al. | |
| 4,821,674 A | 4/1989 | deBoer et al. | |
| 4,827,430 A | 5/1989 | Aid et al. | |
| 4,991,614 A | 2/1991 | Hammel | |
| 5,062,386 A | 11/1991 | Christensen | |
| 5,119,760 A | 6/1992 | McMillan et al. | |
| 5,167,716 A | 12/1992 | Boitnott et al. | |
| 5,199,603 A | 4/1993 | Prescott | |
| 5,221,556 A | 6/1993 | Hawkins et al. | |
| 5,242,539 A | 9/1993 | Kumihashi et al. | |
| 5,243,195 A | 9/1993 | Nishi | |
| 5,326,427 A | 7/1994 | Jerbic | |
| 5,380,367 A | 1/1995 | Bertone | |
| 5,595,606 A | 1/1997 | Fujikawa et al. | |
| 5,632,919 A | 5/1997 | MacCracken et al. | |
| 5,730,801 A | 3/1998 | Tepman | |
| 5,732,744 A | 3/1998 | Barr et al. | |
| 5,736,314 A | 4/1998 | Hayes et al. | |
| 5,796,074 A | 8/1998 | Edelstein et al. | |
| 5,836,483 A | 11/1998 | Disel | |
| 5,855,680 A | 1/1999 | Soininen et al. | |
| 5,979,506 A | 11/1999 | Aarseth | |
| 6,013,553 A | 1/2000 | Wallace et al. | |
| 6,015,465 A | 1/2000 | Kholodenko et al. | |
| 6,060,691 A | 5/2000 | Minami et al. | |
| 6,074,443 A | 6/2000 | Venkatesh | |
| 6,083,321 A | 7/2000 | Lei et al. | |
| 6,086,677 A | 7/2000 | Umotoy et al. | |
| 6,122,036 A | 9/2000 | Yamasaki et al. | |
| 6,125,789 A | 10/2000 | Gupta et al. | |
| 6,129,044 A | 10/2000 | Zhao et al. | |
| 6,148,761 A | 11/2000 | Majewski et al. | |
| 6,161,500 A | 12/2000 | Kopacz et al. | |
| 6,201,999 B1 | 3/2001 | Jevtic | |
| 6,274,878 B1 | 8/2001 | Li et al. | |
| 6,287,965 B1 | 9/2001 | Kang et al. | |
| 6,302,964 B1 | 10/2001 | Umotoy et al. | |
| 6,312,525 B1 | 11/2001 | Bright et al. | |
| 6,326,597 B1 | 12/2001 | Lubomirsky et al. | |
| 6,342,427 B1 | 1/2002 | Choi et al. | |
| 6,367,410 B1 | 4/2002 | Leahey et al. | |
| 6,368,987 B1 | 4/2002 | Kopacz et al. | |
| 6,410,459 B2 | 6/2002 | Blalock et al. | |
| 6,420,279 B1 | 7/2002 | Ono et al. | |
| 6,454,860 B2 | 9/2002 | Metzner et al. | |
| 6,478,872 B1 | 11/2002 | Chae et al. | |
| 6,482,331 B2 | 11/2002 | Lu et al. | |
| 6,483,989 B1 | 11/2002 | Okada et al. | |
| 6,511,539 B1 | 1/2003 | Raaijmakers | |
| 6,534,395 B2 | 3/2003 | Werkhoven et al. | |
| 6,569,239 B2 | 5/2003 | Arai et al. | |
| 6,590,251 B2 | 7/2003 | Kang et al. | |
| 6,594,550 B1 | 7/2003 | Okrah | |
| 6,598,559 B1 | 7/2003 | Vellore et al. | |
| 6,627,503 B2 | 9/2003 | Ma et al. | |
| 6,633,364 B2 | 10/2003 | Hayashi | |
| 6,648,974 B1 | 11/2003 | Ogliari et al. | |
| 6,682,973 B1 | 1/2004 | Paton et al. | |
| 6,709,989 B2 | 3/2004 | Ramdani et al. | |
| 6,710,364 B2 | 3/2004 | Guldi et al. | |
| 6,734,090 B2 | 5/2004 | Agarwala et al. | |
| 6,820,570 B2 | 11/2004 | Kilpela et al. | |
| 6,821,910 B2 | 11/2004 | Adomaitis et al. | |
| 6,824,665 B2 | 11/2004 | Shelnut et al. | |
| 6,847,014 B1 | 1/2005 | Benjamin et al. | |
| 6,858,524 B2 * | 2/2005 | Haukka et al. | 438/585 |
| 6,858,547 B2 | 2/2005 | Metzner | |
| 6,863,019 B2 | 3/2005 | Shamouilian | |
| 6,874,480 B1 | 4/2005 | Ismailov | |
| 6,875,677 B1 | 4/2005 | Conley, Jr. et al. | |
| 6,884,066 B2 | 4/2005 | Nguyen et al. | |
| 6,889,864 B2 | 5/2005 | Lindfors et al. | |
| 6,909,839 B2 | 6/2005 | Wang et al. | |
| 6,930,059 B2 | 8/2005 | Conley, Jr. et al. | |
| 6,935,269 B2 | 8/2005 | Lee et al. | |
| 6,955,836 B2 | 10/2005 | Kumagai et al. | |
| 7,045,430 B2 | 5/2006 | Ahn et al. | |
| 7,053,009 B2 | 5/2006 | Conley, Jr. et al. | |
| 7,071,051 B1 | 7/2006 | Jeon et al. | |
| 7,115,838 B2 | 10/2006 | Kurara et al. | |
| 7,122,085 B2 | 10/2006 | Shero et al. | |
| 7,129,165 B2 | 10/2006 | Basol et al. | |
| 7,132,360 B2 | 11/2006 | Schaeffer et al. | |
| 7,135,421 B2 | 11/2006 | Ahn et al. | |
| 7,147,766 B2 | 12/2006 | Uzoh et al. | |
| 7,172,497 B2 | 2/2007 | Basol et al. | |
| 7,192,824 B2 | 3/2007 | Ahn et al. | |
| 7,192,892 B2 | 3/2007 | Ahn et al. | |
| 7,195,693 B2 | 3/2007 | Cowans | |
| 7,204,887 B2 | 4/2007 | Kawamura et al. | |
| 7,205,247 B2 | 4/2007 | Lee et al. | |
| 7,235,501 B2 | 6/2007 | Ahn et al. | |
| 7,312,494 B2 | 12/2007 | Ahn et al. | |
| 7,329,947 B2 | 2/2008 | Adachi et al. | |
| 7,357,138 B2 | 4/2008 | Ji et al. | |
| 7,393,736 B2 | 7/2008 | Ahn et al. | |
| 7,402,534 B2 | 7/2008 | Mahajani | |
| 7,405,166 B2 | 7/2008 | Liang et al. | |
| 7,405,454 B2 | 7/2008 | Ahn et al. | |
| 7,414,281 B1 | 8/2008 | Fastow | |
| 7,437,060 B2 | 10/2008 | Wang et al. | |
| 7,442,275 B2 | 10/2008 | Cowans | |
| 7,489,389 B2 | 2/2009 | Shibazaki | |
| 7,547,363 B2 | 6/2009 | Tomiyasu et al. | |
| 7,601,223 B2 | 10/2009 | Lindfors et al. | |
| 7,601,225 B2 | 10/2009 | Tuominen et al. | |
| 7,640,142 B2 | 12/2009 | Tachikawa et al. | |
| 7,651,583 B2 | 1/2010 | Kent et al. | |
| D614,153 S | 4/2010 | Fondurulia et al. | |
| 7,720,560 B2 | 5/2010 | Menser et al. | |
| 7,723,648 B2 | 5/2010 | Tsukamoto et al. | |
| 7,740,705 B2 | 6/2010 | Li | |
| 7,780,440 B2 | 8/2010 | Shibagaki et al. | |
| 7,833,353 B2 | 11/2010 | Furukawahara et al. | |
| 7,851,019 B2 | 12/2010 | Tuominen et al. | |
| 7,884,918 B2 | 2/2011 | Hattori | |
| 8,041,197 B2 | 10/2011 | Kasai et al. | |
| 8,055,378 B2 | 11/2011 | Numakura | |
| 8,071,451 B2 | 12/2011 | Berry | |
| 8,071,452 B2 | 12/2011 | Raisanen | |
| 8,072,578 B2 | 12/2011 | Yasuda et al. | |
| 8,076,230 B2 | 12/2011 | Wei | |
| 8,076,237 B2 | 12/2011 | Uzoh | |
| 8,082,946 B2 | 12/2011 | Laverdiere et al. | |
| 8,092,604 B2 | 1/2012 | Tomiyasu et al. | |
| 8,137,462 B2 | 3/2012 | Fondurulia et al. | |
| 8,147,242 B2 | 4/2012 | Shibagaki et al. | |
| 8,216,380 B2 | 7/2012 | White et al. | |
| 8,278,176 B2 | 10/2012 | Bauer et al. | |
| 8,282,769 B2 | 10/2012 | Iizuka | |
| 8,287,648 B2 | 10/2012 | Reed et al. | |
| 8,293,016 B2 | 10/2012 | Bahng et al. | |
| 8,309,173 B2 | 11/2012 | Tuominen et al. | |

(56) References Cited

U.S. PATENT DOCUMENTS

| | | |
|---|---|---|
| 8,367,528 B2 | 2/2013 | Bauer et al. |
| 8,444,120 B2 | 5/2013 | Gregg et al. |
| 8,608,885 B2 | 12/2013 | Goto et al. |
| 8,683,943 B2 | 4/2014 | Onodera et al. |
| 8,711,338 B2 | 4/2014 | Liu et al. |
| 8,726,837 B2 | 5/2014 | Patalay et al. |
| 8,728,832 B2 | 5/2014 | Raisanen et al. |
| 8,802,201 B2 | 8/2014 | Raisanen et al. |
| 8,877,655 B2 | 11/2014 | Shero et al. |
| 8,883,270 B2 | 11/2014 | Shero et al. |
| 2002/0001974 A1 | 1/2002 | Chan |
| 2002/0011210 A1 | 1/2002 | Satoh et al. |
| 2002/0064592 A1 | 5/2002 | Datta et al. |
| 2002/0098627 A1 | 7/2002 | Pomarede et al. |
| 2002/0108670 A1 | 8/2002 | Baker et al. |
| 2002/0115252 A1 | 8/2002 | Haukka et al. |
| 2002/0172768 A1 | 11/2002 | Endo et al. |
| 2002/0187650 A1 | 12/2002 | Blalock et al. |
| 2003/0019580 A1 | 1/2003 | Strang |
| 2003/0025146 A1 | 2/2003 | Narwankar et al. |
| 2003/0042419 A1 | 3/2003 | Katsumata et al. |
| 2003/0066826 A1 | 4/2003 | Lee et al. |
| 2003/0075925 A1 | 4/2003 | Lindfors et al. |
| 2003/0111963 A1 | 6/2003 | Tolmachev et al. |
| 2003/0141820 A1 | 7/2003 | White et al. |
| 2003/0228772 A1 | 12/2003 | Cowans |
| 2003/0232138 A1 | 12/2003 | Tuominen et al. |
| 2004/0013577 A1 | 1/2004 | Ganguli et al. |
| 2004/0023516 A1 | 2/2004 | Londergan et al. |
| 2004/0036129 A1* | 2/2004 | Forbes et al. ............... 257/407 |
| 2004/0077182 A1 | 4/2004 | Lim et al. |
| 2004/0106249 A1* | 6/2004 | Huotari ........................ 438/216 |
| 2004/0144980 A1 | 7/2004 | Ahn et al. |
| 2004/0168627 A1 | 9/2004 | Conley et al. |
| 2004/0169032 A1 | 9/2004 | Murayama et al. |
| 2004/0198069 A1 | 10/2004 | Metzner et al. |
| 2004/0200499 A1 | 10/2004 | Harvey et al. |
| 2004/0219793 A1 | 11/2004 | Hishiya et al. |
| 2004/0221807 A1 | 11/2004 | Verghese et al. |
| 2004/0266011 A1 | 12/2004 | Lee et al. |
| 2005/0008799 A1 | 1/2005 | Tomiyasu et al. |
| 2005/0019026 A1 | 1/2005 | Wang et al. |
| 2005/0020071 A1 | 1/2005 | Sonobe et al. |
| 2005/0023624 A1 | 2/2005 | Ahn et al. |
| 2005/0054228 A1 | 3/2005 | March |
| 2005/0066893 A1 | 3/2005 | Soininen |
| 2005/0070123 A1 | 3/2005 | Hirano |
| 2005/0072357 A1 | 4/2005 | Shero et al. |
| 2005/0092249 A1 | 5/2005 | Kilpela et al. |
| 2005/0100669 A1 | 5/2005 | Kools et al. |
| 2005/0106893 A1 | 5/2005 | Wilk |
| 2005/0110069 A1 | 5/2005 | Kil et al. |
| 2005/0173003 A1 | 8/2005 | Laverdiere et al. |
| 2005/0187647 A1 | 8/2005 | Wang et al. |
| 2005/0212119 A1 | 9/2005 | Shero |
| 2005/0214457 A1 | 9/2005 | Schmitt et al. |
| 2005/0214458 A1 | 9/2005 | Meiere |
| 2005/0218462 A1 | 10/2005 | Ahn et al. |
| 2005/0229972 A1 | 10/2005 | Hoshi et al. |
| 2005/0241176 A1 | 11/2005 | Shero et al. |
| 2005/0263075 A1 | 12/2005 | Wang et al. |
| 2005/0271813 A1 | 12/2005 | Kher et al. |
| 2005/0282101 A1 | 12/2005 | Adachi |
| 2006/0013946 A1 | 1/2006 | Park et al. |
| 2006/0014384 A1 | 1/2006 | Lee et al. |
| 2006/0019033 A1 | 1/2006 | Muthukrishnan et al. |
| 2006/0024439 A2 | 2/2006 | Tuominen et al. |
| 2006/0046518 A1 | 3/2006 | Hill et al. |
| 2006/0051925 A1 | 3/2006 | Ahn et al. |
| 2006/0060930 A1 | 3/2006 | Metz et al. |
| 2006/0062910 A1 | 3/2006 | Meiere |
| 2006/0063346 A1 | 3/2006 | Lee et al. |
| 2006/0110934 A1 | 5/2006 | Fukuchi |
| 2006/0113675 A1 | 6/2006 | Chang et al. |
| 2006/0128168 A1 | 6/2006 | Ahn et al. |
| 2006/0148180 A1 | 7/2006 | Ahn et al. |
| 2006/0193979 A1 | 8/2006 | Meiere et al. |
| 2006/0208215 A1 | 9/2006 | Metzner et al. |
| 2006/0213439 A1 | 9/2006 | Ishizaka |
| 2006/0223301 A1 | 10/2006 | Vanhaelemeersch et al. |
| 2006/0226117 A1 | 10/2006 | Bertram et al. |
| 2006/0228888 A1 | 10/2006 | Lee et al. |
| 2006/0240574 A1 | 10/2006 | Yoshie |
| 2006/0257563 A1 | 11/2006 | Doh et al. |
| 2006/0258078 A1 | 11/2006 | Lee et al. |
| 2006/0266289 A1 | 11/2006 | Verghese et al. |
| 2007/0010072 A1 | 1/2007 | Bailey et al. |
| 2007/0020953 A1 | 1/2007 | Tsai et al. |
| 2007/0022954 A1 | 2/2007 | Iizuka et al. |
| 2007/0028842 A1 | 2/2007 | Inagawa et al. |
| 2007/0031598 A1 | 2/2007 | Okuyama et al. |
| 2007/0031599 A1 | 2/2007 | Gschwandtner et al. |
| 2007/0037412 A1 | 2/2007 | Dip et al. |
| 2007/0042117 A1 | 2/2007 | Kupurao et al. |
| 2007/0049053 A1 | 3/2007 | Mahajani |
| 2007/0059948 A1 | 3/2007 | Metzner et al. |
| 2007/0065578 A1 | 3/2007 | McDougall |
| 2007/0066010 A1 | 3/2007 | Ando |
| 2007/0077355 A1 | 4/2007 | Chacin et al. |
| 2007/0084405 A1 | 4/2007 | Kim |
| 2007/0116873 A1 | 5/2007 | Li et al. |
| 2007/0134942 A1 | 6/2007 | Ahn et al. |
| 2007/0146621 A1 | 6/2007 | Yeom |
| 2007/0155138 A1 | 7/2007 | Tomasini et al. |
| 2007/0166457 A1 | 7/2007 | Yamoto et al. |
| 2007/0175397 A1 | 8/2007 | Tomiyasu et al. |
| 2007/0209590 A1 | 9/2007 | Li |
| 2007/0232501 A1 | 10/2007 | Tonomura |
| 2007/0249131 A1* | 10/2007 | Allen et al. ................... 438/301 |
| 2007/0252244 A1 | 11/2007 | Srividya et al. |
| 2007/0264807 A1 | 11/2007 | Leone et al. |
| 2008/0006208 A1 | 1/2008 | Ueno et al. |
| 2008/0029790 A1 | 2/2008 | Ahn et al. |
| 2008/0054332 A1 | 3/2008 | Kim et al. |
| 2008/0057659 A1 | 3/2008 | Forbes et al. |
| 2008/0075881 A1 | 3/2008 | Won et al. |
| 2008/0085226 A1 | 4/2008 | Fondurulia et al. |
| 2008/0113096 A1 | 5/2008 | Mahajani |
| 2008/0113097 A1 | 5/2008 | Mahajani et al. |
| 2008/0124908 A1 | 5/2008 | Forbes et al. |
| 2008/0149031 A1 | 6/2008 | Chu et al. |
| 2008/0176375 A1 | 7/2008 | Erben et al. |
| 2008/0216077 A1 | 9/2008 | Emani et al. |
| 2008/0224240 A1 | 9/2008 | Ahn et al. |
| 2008/0233288 A1 | 9/2008 | Clark |
| 2008/0261413 A1 | 10/2008 | Mahajani |
| 2008/0282970 A1 | 11/2008 | Heys et al. |
| 2008/0315292 A1 | 12/2008 | Ji et al. |
| 2009/0000550 A1 | 1/2009 | Tran et al. |
| 2009/0011608 A1 | 1/2009 | Nabatame |
| 2009/0020072 A1 | 1/2009 | Mizunaga et al. |
| 2009/0029564 A1 | 1/2009 | Yamashita et al. |
| 2009/0035947 A1 | 2/2009 | Horii |
| 2009/0061644 A1 | 3/2009 | Chiang et al. |
| 2009/0085156 A1 | 4/2009 | Dewey et al. |
| 2009/0095221 A1 | 4/2009 | Tam et al. |
| 2009/0107404 A1 | 4/2009 | Ogliari et al. |
| 2009/0136668 A1 | 5/2009 | Gregg et al. |
| 2009/0211523 A1 | 8/2009 | Kuppurao et al. |
| 2009/0211525 A1 | 8/2009 | Sarigiannis et al. |
| 2009/0239386 A1 | 9/2009 | Suzaki et al. |
| 2009/0242957 A1 | 10/2009 | Ma et al. |
| 2009/0246374 A1 | 10/2009 | Vukovic |
| 2009/0261331 A1 | 10/2009 | Yang et al. |
| 2009/0277510 A1 | 11/2009 | Shikata |
| 2009/0283041 A1 | 11/2009 | Tomiyasu et al. |
| 2010/0024727 A1 | 2/2010 | Kim et al. |
| 2010/0025796 A1 | 2/2010 | Dabiran |
| 2010/0055312 A1 | 3/2010 | Kato et al. |
| 2010/0075507 A1 | 3/2010 | Chang et al. |
| 2010/0102417 A1* | 4/2010 | Ganguli et al. ............... 257/532 |
| 2010/0124610 A1 | 5/2010 | Aikawa et al. |
| 2010/0130017 A1 | 5/2010 | Luo et al. |
| 2010/0170441 A1 | 7/2010 | Won et al. |

(56) References Cited

U.S. PATENT DOCUMENTS

| | | | |
|---|---|---|---|
| 2010/0193501 A1 | 8/2010 | Zucker et al. |
| 2010/0230051 A1 | 9/2010 | Iizuka |
| 2010/0255198 A1 | 10/2010 | Cleary et al. |
| 2010/0275846 A1 | 11/2010 | Kitagawa |
| 2010/0294199 A1 | 11/2010 | Tran et al. |
| 2010/0307415 A1 | 12/2010 | Shero et al. |
| 2010/0322604 A1 | 12/2010 | Fondurulia et al. |
| 2011/0000619 A1 | 1/2011 | Suh |
| 2011/0061810 A1 | 3/2011 | Ganguly et al. |
| 2011/0070380 A1 | 3/2011 | Shero et al. |
| 2011/0097901 A1 | 4/2011 | Banna et al. |
| 2011/0108194 A1 | 5/2011 | Yoshioka et al. |
| 2011/0236600 A1 | 9/2011 | Fox et al. |
| 2011/0239936 A1 | 10/2011 | Suzaki et al. |
| 2011/0256734 A1 | 10/2011 | Hausmann et al. |
| 2011/0275166 A1 | 11/2011 | Shero et al. |
| 2011/0308460 A1 | 12/2011 | Hong et al. |
| 2012/0024479 A1 | 2/2012 | Palagashvili et al. |
| 2012/0070997 A1 | 3/2012 | Larson |
| 2012/0090704 A1 | 4/2012 | Laverdiere et al. |
| 2012/0098107 A1 | 4/2012 | Raisanen et al. |
| 2012/0114877 A1 | 5/2012 | Lee |
| 2012/0156108 A1 | 6/2012 | Fondurulia et al. |
| 2012/0160172 A1 | 6/2012 | Wamura et al. |
| 2012/0240858 A1 | 9/2012 | Taniyama et al. |
| 2012/0289053 A1 | 11/2012 | Holland et al. |
| 2012/0295427 A1 | 11/2012 | Bauer |
| 2012/0304935 A1 | 12/2012 | Oosterlaken et al. |
| 2013/0023129 A1 | 1/2013 | Reed |
| 2013/0104988 A1 | 5/2013 | Yednak et al. |
| 2013/0104992 A1 | 5/2013 | Yednak et al. |
| 2013/0126515 A1 | 5/2013 | Shero et al. |
| 2013/0129577 A1 | 5/2013 | Halpin et al. |
| 2013/0230814 A1 | 9/2013 | Dunn et al. |
| 2013/0264659 A1 | 10/2013 | Jung |
| 2013/0292676 A1 | 11/2013 | Milligan et al. |
| 2013/0292807 A1 | 11/2013 | Raisanen et al. |
| 2014/0000843 A1 | 1/2014 | Dunn et al. |
| 2014/0014644 A1 | 1/2014 | Akiba et al. |
| 2014/0027884 A1 | 1/2014 | Fang et al. |
| 2014/0036274 A1 | 2/2014 | Marquardt et al. |
| 2014/0060147 A1 | 3/2014 | Sarin et al. |
| 2014/0067110 A1 | 3/2014 | Lawson et al. |
| 2014/0073143 A1 | 3/2014 | Alokozai et al. |
| 2014/0084341 A1 | 3/2014 | Weeks |
| 2014/0103145 A1 | 4/2014 | White et al. |
| 2014/0120487 A1 | 5/2014 | Kaneko |
| 2014/0159170 A1 | 6/2014 | Raisanen et al. |
| 2014/0175054 A1 | 6/2014 | Carlson et al. |
| 2014/0217065 A1 | 8/2014 | Winkler et al. |
| 2014/0220247 A1 | 8/2014 | Haukka et al. |
| 2014/0251953 A1 | 9/2014 | Winkler et al. |
| 2014/0251954 A1 | 9/2014 | Winkler et al. |
| 2014/0346650 A1 | 11/2014 | Raisanen et al. |
| 2015/0024609 A1 | 1/2015 | Milligan et al. |
| 2015/0048485 A1 | 2/2015 | Tolle |

FOREIGN PATENT DOCUMENTS

| | | |
|---|---|---|
| CN | 101522943 | 9/2009 |
| CN | 101423937 | 9/2011 |
| JP | 07283149 | 10/1995 |
| JP | 08335558 | 12/1996 |
| JP | 2001342570 | 12/2001 |
| JP | 2004014952 | 1/2004 |
| JP | 2004091848 | 3/2004 |
| JP | 2004538374 | 12/2004 |
| JP | 2005507030 | 3/2005 |
| JP | 2006186271 | 7/2006 |
| JP | 2008527748 | 7/2008 |
| TW | I226380 | 1/2005 |
| TW | 200701301 | 1/2007 |
| WO | 2006/056091 | 6/2006 |
| WO | 2006/078666 | 7/2006 |

OTHER PUBLICATIONS

USPTO; Final Office Action dated Jul. 14, 2014 in U.S. Appl. No. 12/754,223.
USPTO; Notice of Allowance dated Jul. 3, 2014 in U.S. Appl. No. 13/102,980.
USPTO; Office Action dated Jun. 3, 2014 in U.S. Appl. No. 12/854,818.
USPTO; Non-Final Office Action dated Jul. 2, 2014 in U.S. Appl. No. 13/283,408.
USPTO; Non-Final Office Action dated Jul. 30, 2014 in U.S. Appl. No. 13/284,642.
USPTO; Office Action dated Jul. 31, 2014 in U.S. Appl. No. 13/411,271.
USPTO Final Office Action dated Jul. 8, 2014 in U.S. Appl. No. 13/439,528.
USPTO; Final Office Action dated Jun. 18, 2014 in U.S. Appl. No. 13/535,214.
USPTO; Non-Final Office Action dated Aug. 8, 2014 in U.S. Appl. No. 13/563,066.
USPTO; Non-Final Office Action dated Jul. 10, 2014 in U.S. Appl. No. 13/612,538.
USPTO; Non-Final Office Action dated Jun. 2, 2014 in U.S. Appl. No. 13/677,151.
USPTO; Notice of Allowance dated Aug. 13, 2014 in U.S. Appl. No. 13/784,362.
USPTO; Non-Final Office Action dated May 29, 2014 in U.S. Appl. No. 14/183,187.
Chinese Patent Office; Notice on the Third Office Action dated Jul. 1, 2014 in Application No. 201080036764.6.
Taiwan Patent Office; Office Action dated Jul. 4, 2014 in Application No. 099110511.
USPTO; Office Action dated Aug. 27, 2010 in U.S. Appl. No. 12/118,596.
USPTO; Office Action dated Feb. 15, 2011 in U.S. Appl. No. 12/118,596.
USPTO; Notice of Allowance dated Aug. 4, 2011 in U.S. Appl. No. 12/118,596.
USPTO; Notice of Allowance dated Jun. 16, 2011 in U.S. Appl. No. 12/430,751.
USPTO; Notice of Allowance dated Jul. 27, 2011 in U.S. Appl. No. 12/430,751.
USPTO; Restriction Requirement dated Jan. 15, 2013 in U.S. Appl. No. 12/754,223.
USPTO; Office Action dated Feb. 26, 2013 in U.S. Appl. No. 12/754,223.
USPTO; Final Office Action dated Jun. 28, 2013 in U.S. Appl. No. 12/754,223.
USPTO; Office Action dated Feb. 25, 2014 in U.S. Appl. No. 12/754,223.
USPTO; Office Action dated Apr. 23, 2013 in U.S. Appl. No. 12/763,037.
USPTO; Final Office Action dated Oct. 21, 2013 in U.S. Appl. No. 12/763,037.
USPTO; Restriction Requirement dated Sep. 25, 2012 in U.S. Appl. No. 12/854,818.
USPTO; Office Action dated Dec. 6, 2012 in U.S. Appl. No. 12/854,818.
USPTO; Final Office Action dated Mar. 13, 2013 in U.S. Appl. No. 12/854,818.
USPTO; Office Action dated Aug. 30, 2013 in U.S. Appl. No. 12/854,818.
USPTO; Final Office Action dated Mar. 26, 2014 in U.S. Appl. No. 12/854,818.
USPTO; Restriction Requirement dated May 8, 2013 in U.S. Appl. No. 13/102,980.
USPTO; Office Action dated Oct. 7, 2013 in U.S. Appl. No. 13/102,980.
USPTO; Final Office Action dated Mar. 25, 2014 in U.S. Appl. No. 13/102,980.
USPTO; Restriction Requirement dated Dec. 16, 2013 in U.S. Appl. No. 13/284,642.

(56) References Cited

OTHER PUBLICATIONS

USPTO; Restriction Requirement dated Apr. 21, 2014 in U.S. Appl. No. 13/284,642.
USPTO; Office Action dated Jan. 28, 2014 in U.S. Appl. No. 13/312,591.
USPTO; Final Office Action dated May 14, 2014 in U.S. Appl. No. 13/312,591.
USPTO; Office Action dated Jan. 10, 2013 in U.S. Appl. No. 13/339,609.
USPTO; Office Action dated Feb. 11, 2013 in U.S. Appl. No. 13/339,609.
USPTO; Final Office Action dated May 17, 2013 in U.S. Appl. No. 13/339,609.
USPTO; Office Action dated Aug. 29, 2013 in U.S. Appl. No. 13/339,609.
USPTO; Final Office Action dated Dec. 18, 2013 in U.S. Appl. No. 13/339,609.
USPTO; Notice of Allowance dated Apr. 7, 2014 in U.S. Appl. No. 13/339,609.
USPTO; Office Action dated Feb. 13, 2014 in U.S. Appl. No. 13/411,271.
USPTO; Restriction Requirement dated Oct. 29, 2013 in U.S. Appl. No. 13/439,258.
USPTO; Office Action dated Mar. 24, 2014 in U.S. Appl. No. 13/439,258.
USPTO; Office Action dated May 23, 2013 in U.S. Appl. No. 13/465,340.
USPTO; Final Office Action dated Oct. 30, 2013 in U.S. Appl. No. 13/465,340.
USPTO; Notice of Allowance dated Feb. 12, 2014 in U.S. Appl. No. 13/465,340.
USPTO; Office Action dated Dec. 20, 2013 in U.S. Appl. No. 13/535,214.
USPTO; Office Action dated Nov. 15, 2013 in U.S. Appl. No. 13/612,538.
USPTO; Office Action dated Apr. 24, 2014 in U.S. Appl. No. 13/784,362.
PCT; International Search report and Written Opinion dated Nov. 12, 2010 in Application No. PCT/US2010/030126.
PCT; International Search report and Written Opinion dated Jan. 12, 2011 in Application No. PCT/US2010/045368.
PCT; International Search report and Written Opinion dated Feb. 6, 2013 in Application No. PCT/US2012/065343.
PCT; International Search report and Written Opinion dated Feb. 13, 2013 in Application No. PCT/US2012/065347.
Chinese Patent Office; Office Action dated Jan. 10, 2013 in Serial No. 201080015699.9.
Chinese Patent Office; Notice on the First Office Action dated May 24, 2013 in Serial No. 201080036764.6.
Chinese Patent Office; Notice on the Second Office Action dated Jan. 2, 2014 in Serial No. 201080036764.6.
Japanese Patent Office; Office Action dated Jan. 25, 2014 in Serial No. 2012-504786.
Chang et al. Small-Subthreshold-Swing and Low-Voltage Flexible Organic Thin-Film Transistors Which Use HfLaO as the Gate Dielectric; IEEE Electron Device Letters; Feb. 2009; 133-135; vol. 30, No. 2; IEEE Electron Device Society.
Maeng et al. Electrical properties of atomic layer disposition Hf02 and HfOxNy on Si substrates with various crystal orientations, Journal of the Electrochemical Society, Apr. 2008, p. H267-H271, vol. 155, No. 4, Department of Materials Science and Engineering, Pohang University of Science and Technology, Pohang, Korea.
Novaro et al. Theoretical Study on a Reaction Pathway of Ziegler-Natta-Type Catalysis, J. Chem.Phys. 68(5), Mar. 1, 1978 p. 2337-2351.
USPTO; Office Action dated Oct. 8, 2014 in U.S. Appl. No. 12/763,037.
USPTO; Non-Final Office Action dated Sep. 17, 2014 in U.S. Appl. No. 13/187,300.
USPTO; Non-Final Office Action dated Nov. 26, 2014 in U.S. Appl. No. 13/312,591.
UPPTO; Notice of Allowance dated Oct. 21, 2014 in U.S. Appl. No. 13/439,528.
USPTO; Notice of Allowance dated Oct. 23, 2014 in U.S. Appl. No. 13/535,214.
USPTO; Non-Final Office Action dated Oct. 15, 2014 in U.S. Appl. No. 13/597,043.
USPTO; Final Office Action dated Nov. 14, 2014 in U.S. Appl. No. 13/677,151.
USPTO; Non-Final Office Action dated Oct. 9, 2014 in U.S. Appl. No. 13/874,708.
USPTO; Non-Final Office Action dated Sep. 19, 2014 in U.S. Appl. No. 13/791,246.
USPTO; Non-Final Office Action dated Sep. 12, 2014 in U.S. Appl. No. 13/941,134.
USPTO; Restriction Requirement dated Sep. 16, 2014 in U.S. Appl. No. 13/948,055.
USPTO; Non-Final Office Action dated Oct. 30, 2014 in U.S. Appl. No. 13/948,055.
USPTO; Final Office Action dated Nov. 7, 2014 in U.S. Appl. No. 14/183,187.
Chinese Patent Office; Notice on the Second Office Action dated Sep. 16, 2014 in Application No. 201110155056.
Koutsokeras et al. Texture and Microstructure Evolution in Single-Phase TixTl-xN Alloys of Rocksalt Structure. Journal of Applied Physics, 110, pp. 043535-1-043535-6, (2011).
USPTO; Notice of Allowance dated Jan. 27, 2015 in U.S. Appl. No. 12/763,037.
USPTO; Final Office Action dated Jan. 29, 2015 in U.S. Appl. No. 13/283,408.
USPTO; Notice of Allowance dated Feb. 11, 2015 in U.S. Appl. No. 13/284,642.
USPTO; Final Office Action dated Jan. 16, 2015 in U.S. Appl. No. 13/411,271.
USPTO; Final Office Action dated Feb. 12, 2015 in U.S. Appl. No. 13/563,066.
USPTO; Non-Final Office Action dated Feb. 12, 2015 in U.S. Appl. No. 13/597,108.
USPTO; Notice of Allowance dated Feb. 26, 2015 in U.S. Appl. No. 13/677,151.
USPTO; Notice of Allowance dated Jan. 20, 2015 in U.S. Appl. No. 13/941,134.
USPTO; Non-Final Office Action dated Feb. 12, 2015 in U.S. Appl. No. 14/457,058.
USPTO; Non-Final Office Action dated Jan. 16, 2015 in U.S. Appl. No. 14/563,044.
Chinese Patent Office; Office Action dated Jan. 12, 2015 in Application No. 201080015699.9.
Chinese Patent Office; Notice on the Third Office Action dated Feb. 9, 2015 in Application No. 201110155056.
Japanese Patent Office; Office Action dated Dec. 1, 2014 in Application No. 2012-504786.
Taiwan Patent Office; Office Action dated Dec. 30, 2014 in Application No. 099114330.
Taiwan Patent Office; Office Action dated Dec. 19, 2014 in Application No. 099127063.

* cited by examiner

PHASE-STABILIZED THIN FILMS, STRUCTURES AND DEVICES INCLUDING THE THIN FILMS, AND METHODS OF FORMING SAME

CROSS REFERENCE TO RELATED APPLICATION

This application claims the right of priority based on U.S. Provisional Patent Application No. 61/641,602 entitled "FORMATION OF PHASE-STABILIZED THIN FILMS," filed on May 2, 2012, which is incorporated herein by reference, to the extent it does not conflict with the present disclosure.

FIELD OF INVENTION

The present disclosure generally relates to thin-film deposition techniques. More particularly, the disclosure relates to thin films including a phase stabilizer, to structures and devices including the films, and to methods of forming the films, structures, and devices.

BACKGROUND OF THE DISCLOSURE

Many semiconductor devices include non-silicon work function materials. For example, metal-oxide semiconductor (MOS) devices may include a gate electrode that includes a metal to assist in setting the effective work function for the gate electrode. Use of metal-containing electrodes in such devices has become increasingly important as the feature size of the devices decreases. Although various processes for forming metal gate electrodes have been developed, many of these processes exhibit unacceptable feature-size dependent performance variations. As a result, as the feature sizes of semiconductor devices decrease, these processes become increasingly problematic.

For example, in some devices, the effective work function of a metal-containing gate electrode may be determined by averaging work functions exhibited by domains within the gate electrode film that may have different crystal orientations and/or morphological phases of the metal gate electrode material. In some settings, the size of these domains may vary according to film deposition conditions and/or film thickness. As a gate length becomes smaller in MOS devices, the domain size may occupy a relatively larger portion of gate electrode, potentially leading to domain-specific work function differences that may have a greater effect on the overall work function of the device. In turn, there may be gate-to-gate work function variation that depends on the gate feature size, which may result in poor device performance.

Metal gate electrodes may also be difficult to integrate into device manufacturing processes because it can be difficult to deposit metal gate electrode films having desired film uniformity or other properties. For example, some semiconductor devices may include a three-dimensional gate dielectric supporting structure, such as a fin extending from the substrate that supports gate dielectric material on one or more of surfaces of the fin, or a replacement gate structure including an opening formed in the substrate surface that supports gate dielectric material on one or more surfaces therein. Depositing thin films of metal gate electrode material on the sidewalls of such structures may be challenging when using some existing deposition processes approaches. For example, mass transport phenomena inherent in physical vapor deposition (PVD) and chemical vapor deposition (CVD) techniques may provide poor step coverage in such structures and may lead to inconsistent film thickness as a function of the gate dielectric supporting structure height.

Further, because some properties of a material that may make it attractive as a potential metal gate electrode material may not be present in a thermodynamically stable phase of the material, it may be difficult to form a desirable but less stable phase of the material using traditional PVD and CVD techniques. For example, a PVD deposition may lead to a film initially having identical composition as the target or targets, and the high energies involved in the PVD process may lead to equilibration into a more thermodynamically stable form of the material, which has less desirable work function properties. As another example, attempts to form desirable metastable phases of material with CVD processes may lead to incomplete conversion and within substrate compositional non-uniformities, potentially leading to downstream processing difficulties and/or device performance problems. Accordingly, improved phase-stabilized films and methods of forming the films are desired.

SUMMARY OF THE DISCLOSURE

Various embodiments of the present disclosure relate to phase-stabilized films, methods of forming phase-stabilized films, and structures and devices including the phase-stabilized films. The phase-stabilized films described herein may be used, for example, for gate electrodes and similar films in microelectronic devices. While the ways in which various embodiments of the disclosure address the drawbacks of the prior art methods and films is discussed in more detail below, in general, the disclosure provides phase-stabilized films that may have more desirable properties when used as a gate electrode in, for example, metal oxide semiconductor devices, compared to films that might otherwise form without a phase stabilizer. However, the invention is not necessarily limited to such applications.

In accordance with various embodiments of the disclosure, methods of forming phase-stabilized nitrogen-containing films include supporting a substrate in a reactor and forming a phase-stabilized nitrogen-containing film on an exposed surface of the substrate. In accordance with various aspects of these embodiments, a method includes the steps of supplying a phase stabilizer precursor and a matrix material precursor to an exposed surface of the substrate and supplying a nitrogen-containing reactant to the reactor so that the nitrogen-containing reactant reacts with active species on the exposed surface of the substrate to form the phase-stabilized film. The steps of supplying a phase stabilizer precursor and a matrix material precursor may be performed concurrently or may be performed as sequential pulses. In accordance with further aspects of these embodiments, the phase-stabilized nitrogen-containing film comprises a phase-stabilized metal nitride film. The phase-stabilized metal nitride film may be formed on a substrate supported in a reactor, where the phase-stabilized metal nitride film comprises a phase stabilizer that stabilizes a matrix material comprising a metal nitride into a selected solid phase. In this example, the phase-stabilized metal nitride film may be formed on the exposed surface of the substrate by concurrently or sequentially (e.g., pulsing) supplying a phase stabilizer precursor and a metal nitride precursor to an exposed surface of the substrate and then supplying a nitrogen-containing reactant to the reactor so that the nitrogen-containing reactant reacts with active species on the exposed surface of the substrate to from the phase-stabilized metal nitride film. In accordance with yet further aspects of these embodiments, the metal nitride film includes a group V transition metal, such as vanadium, niobium, or tantalum. And, in accordance with further aspects, the phase stabilizer comprises a group IV transition metal, such as titanium, zirconium, or hafnium and/or a group VI transition metal, such as chromium, molybdenum, or tungsten. And, in accordance with yet additional exemplary embodiments, the nitrogen-containing film comprises $Ta_xTi_{(1-x)}N$. A treatment gas, such as hydrogen may be used during the formation of the film to facilitate formation of nitrogen-containing films having desired morphology and/or properties. The films formed in accordance with these methods may be used as gate electrodes or other layers within electronic devices.

In accordance with additional embodiments of the disclosure, a phase-stabilized nitrogen-containing film includes a solid solution having a stoichiometric ratio of $Mm_{zx}Ms_{(z-x)}X$, where MmX represents the matrix material and where Ms represents the phase stabilizer. MmX may be a first metal nitride (e.g., $Mm_xN_y$) and Ms may be a second metal that stabilizes the matrix material into a selected phase. The matrix material $Mm_xN_y$ may determine one or more electrical properties of the phase-stabilized film (e.g., a work function) while a second metal nitride $Ms_xN_y$ may determine or affect morphological characteristics for the phase-stabilized film (e.g., a cubic phase), even if a native metal nitride metal nitride $Mm_aN_b$ would exhibit a different morphology under identical film formation conditions. In accordance with various aspects of these embodiments, X is nitrogen. In accordance with further aspects, Mm is one or more group V transition metals, such as vanadium, niobium, or tantalum. In accordance with further aspects, Ms includes one or more group IV transition metals, such as titanium, zirconium, or hafnium and/or group VI transition metal, such as chromium, molybdenum, and tungsten.

In accordance with yet additional embodiments of the disclosure, a structure, e.g., a semiconductor structure, includes a gate dielectric material and a metal gate electrode material comprising a solid solution formed overlying the gate dielectric material, the solid solution comprising a phase stabilizer that stabilizes a metal nitride in a solution phase that is different from a native phase of the metal nitride that would be formed under identical film formation conditions. The structure may additionally include a substrate, such as a semiconductor substrate, and additional layers typically used in the manufacture of electronic devices. In accordance with various aspects of these embodiments, the metal nitride material includes one or more group V transition metals. In accordance with further aspects, the phase stabilizer includes one or more group IV transition metals, such as titanium, zirconium, or hafnium and/or group VI transition metal, such as chromium, molybdenum, and tungsten. The metal nitride may determine one or more electrical properties of the phase-stabilized film (e.g., a work function) while the phase stabilizer may determine or affect morphological characteristics for the phase-stabilized film (e.g., a cubic phase). Structures in accordance with various aspects of these embodiments may be used to form electronic devices, such as metal oxide semiconductor devices.

BRIEF DESCRIPTION OF THE DRAWING FIGURES

A more complete understanding of the embodiments of the present disclosure may be derived by referring to the detailed description and claims when considered in connection with the following illustrative figures.

It will be appreciated that elements in the figures are illustrated for simplicity and clarity and have not necessarily been drawn to scale. For example, the dimensions of some of the elements in the figures may be exaggerated relative to other elements to help to improve understanding of illustrated embodiments of the present disclosure

DETAILED DESCRIPTION OF EXEMPLARY EMBODIMENTS OF THE DISCLOSURE

The description of exemplary embodiments of methods, structures, and devices provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features.

The present disclosure relates, generally, to nitrogen-containing phase-stabilized films, to methods of forming the films, and to structures and devices including the films. As set forth in more detail below, nitrogen-containing phase-stabilized films in accordance with various embodiments of the disclosure include a phase stabilizer to stabilize a solid phase of the nitrogen-containing films. It will be appreciated that the embodiments disclosed herein may be used to form any suitable phase-stabilized film. In addition, it may be possible to address mass transfer phenomena affecting film formation processes on non-planar substrate surfaces and to stabilize otherwise metastable phases of some films using the films and techniques described herein.

As used herein, a phase-stabilized film is a film that includes at least a suitable amount of phase stabilizer to cause a matrix material to form into a selected solid phase, within an acceptable tolerance. A phase stabilizer is a material that provides a morphologically-stabilizing effect to the matrix material, so that the presence of the phase stabilizer causes the matrix material to be stabilized into the selected solid phase. Put another way, a phase-stabilized film includes a phase stabilizer that stabilizes the matrix material into a selected solid phase that would not otherwise form under identical conditions. A matrix material is a material that hosts phase stabilizer. For example, the matrix material may be a metal nitride in a phase-stabilized metal nitride film. Generally, the matrix material is present in a higher atomic concentration than the phase stabilizer.

The nitrogen-containing phase-stabilized films described herein may be formed of a variety of materials. For ease of description, exemplary films and methods of forming the films are described in connection with phase-stabilized metal nitride films. In other words, the examples below describe systems where the matrix material includes a metal nitride. However, it will be appreciated that these descriptions are not intended to be limiting in any sense, and that they may apply to matrix material systems other than metal nitride systems. As used herein, a phase-stabilized metal nitride film is a metal nitride film that includes at least a suitable amount of phase stabilizer to cause the metal nitride to form into a selected solid phase, within an acceptable tolerance. Non-limiting examples of metal nitride films include compounds including nitrogen and one or more elements selected from group V transition metals (e.g., vanadium (V), niobium (Nb), and tantalum (Ta)), and by way of one example, the metal nitride film includes tantalum nitride. It will be appreciated that in some embodiments, other suitable elements, including other metals and/or non-metals, may be included in the metal nitride. Non-limiting examples of phase stabilizers that may be used to stabilize various exemplary metal nitride films include one or more elements selected from group IV transition metals (e.g., titanium (Ti), zirconium (Zr), and hafnium (Hf)) and/or group VI transition metals (e.g., chromium (Cr), molybdenum (Mo), and tungsten (W)), and by way of one example, the phase stabilizer includes titanium.

The phase stabilizer may be included at any suitable concentration. It will be understood that such concentrations may vary depending on the particular phase-stabilized film and phase being formed, and may also vary depending on film application parameters, including, but not limited to, film thickness, sublayer type (e.g., an underlying film on which the phase-stabilized film is to be deposited, such as a gate dielectric film), adlayer type (e.g., an overlying film that will be deposited on top of the phase-stabilized film, such as a capping layer, a mask layer, a contact layer, and the like), process thermal budget, and process etch budget. By way of examples, an amount of phase stabilizer within a nitrogen-containing phase-stabilized film ranges from about 5 to about 75 atomic percent.

In some embodiments, the phase stabilizer may be present in an amount that stabilizes the matrix material in the selected solid phase without affecting a particular characteristic of the matrix material beyond an acceptable tolerance. For example, the phase stabilizer may be provided in an amount suitable to stabilize the selected solid phase without altering an electrical property of the matrix, such as the work function of the matrix material. However, it will be appreciated that if the phase stabilizer is not present in at least a concentration sufficient to cause formation of the selected solid phase, a matrix material having a different phase that is native to those conditions may form instead of the phase-stabilized film.

Because the selected solid phase into which the matrix material is phase-stabilized may exhibit one or more different physical and/or electrical properties from a native phase of the matrix material that would be formed under identical conditions, the phase-stabilized film may offer different functionality in an integrated device than a native phase of the matrix material. For example, a phase-stabilized film may exhibit a different work function or morphological state (e.g., grain size, and/or grain orientation) as a consequence of the stabilizing effect of the phase stabilizer that is different from an unstabilized film having a different morphological phase.

In accordance with various exemplary embodiments of the disclosure, a phase-stabilized film includes a solid solution having a stoichiometric ratio of $Mm_{zx}Ms_{(z-x)}X$, where MmX represents the matrix material and where Ms represents the phase stabilizer. For example, MmX may be a first metal nitride (e.g., $Mm_xN_y$) and Ms may be a second metal that stabilizes the matrix material into a selected phase. In this example, matrix material $Mm_xN_y$, may determine one or more electrical properties of the phase-stabilized film (e.g., a work function) while a second metal nitride $Ms_xN_y$, may determine morphological characteristics for the phase-stabilized film (e.g., a cubic phase), even if a native metal nitride metal nitride $Mm_aN_b$ would exhibit a different morphology under identical film formation conditions.

Figure 1:
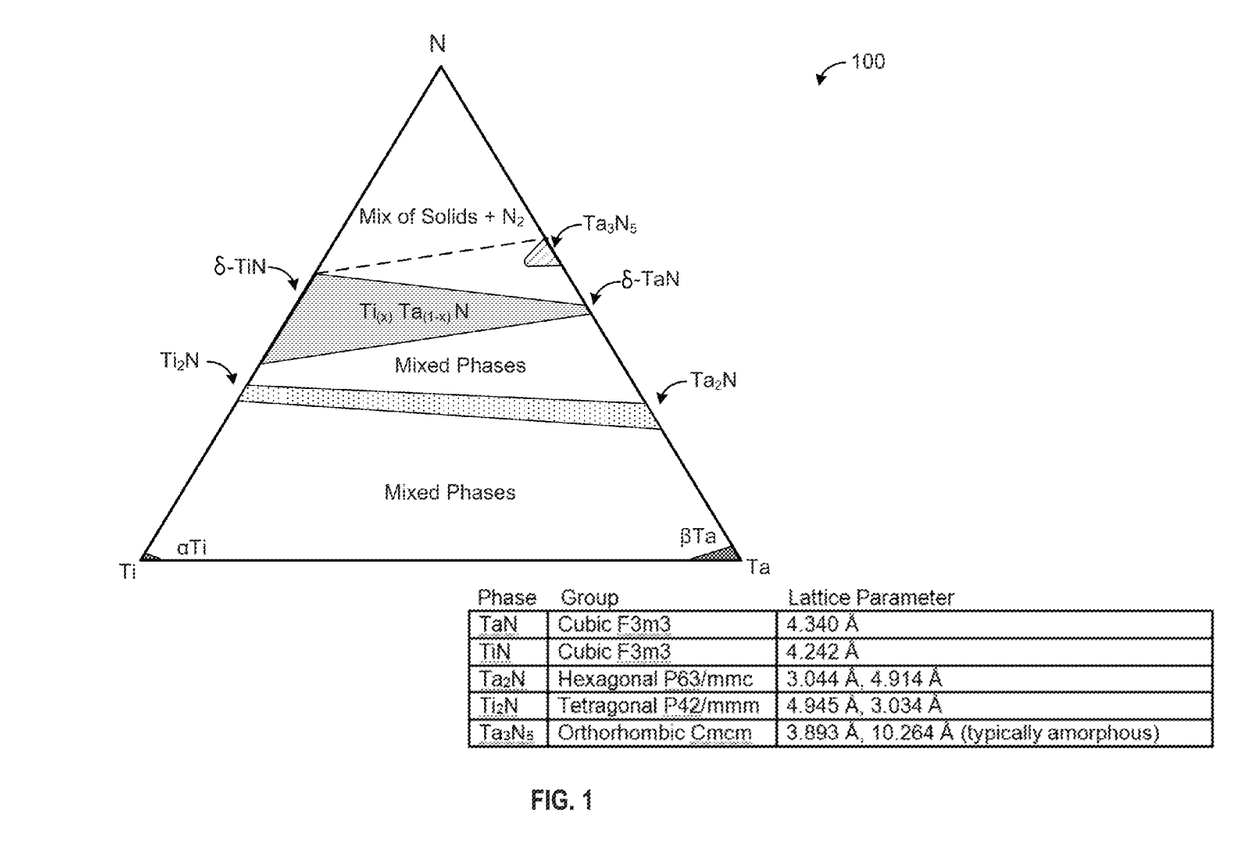
FIG. 1 illustrates a phase diagram for a nitrogen-containing films formed in accordance with exemplary embodiments of the disclosure.

FIG. 1 schematically illustrates an exemplary phase diagram 100 for a Ta—Ti—N system. Phase diagram 100 shows a number of non-homogenous mixed phase regions between various tantalum nitrides and titanium nitrides. Phase diagram 100 also shows a dielectric $Ta_3N_5$ region, which is typically amorphous, though it may exhibit a hexagonal close-packed (hcp) crystal structure in some settings.

Phase diagram 100 also illustrates δ-TiN, a common, stable form of titanium nitride, and δ-TaN, an uncommon, metastable form of tantalum nitride that is not readily formed by traditional chemical or physical film deposition techniques as the comparatively more stable $Ta_3N_5$ film. The dielectric character that accompanies the $Ta_3N_5$ film can be unwelcome in applications where tantalum nitride is intended to be used as a conductor, such as a gate electrode, as the effective oxide thickness of the gate dielectric may increase, potentially diminishing device performance.

Phase diagram 100 also depicts a region believed to be a solid solution of δ-TiN and δ-TaN having a stoichiometric ratio of $Ta_xTi_{(1-x)}N$. Both δ-TiN and δ-TaN exhibit a cubic crystal structure and each material has a lattice parameter (believed to be a=4.242 Å and a=4.340 Å, respectively); the respective lattice parameters are believed to be within about 2.3% of the other. According to Vegard's Law, at a constant temperature, the lattice parameter may vary linearly according to concentrations of those elements in a solid solution. Thus, without wishing to be bound by theory, where two elements exhibit similar lattice parameters and identical crystal groups, it may be likely that those two elements will form a solid solution with one another.

For a similar reason, phase diagram 100 illustrates another region that may represent a solid solution $Ta_{2x}Ti_{(2-x)}N$ formed from $Ti_2N$ and $Ta_2N$. While $Ti_2N$ and $Ta_2N$ have different crystal structures, they exhibit somewhat similar lattice parameters. For example, $Ti_2N$ has lattice parameters believed to be a=4.945, b=a, and c=3.034; $Ta_2N$ has lattice parameters believed to be a=3.044, b=a, and c=4.914.

Figure 2:
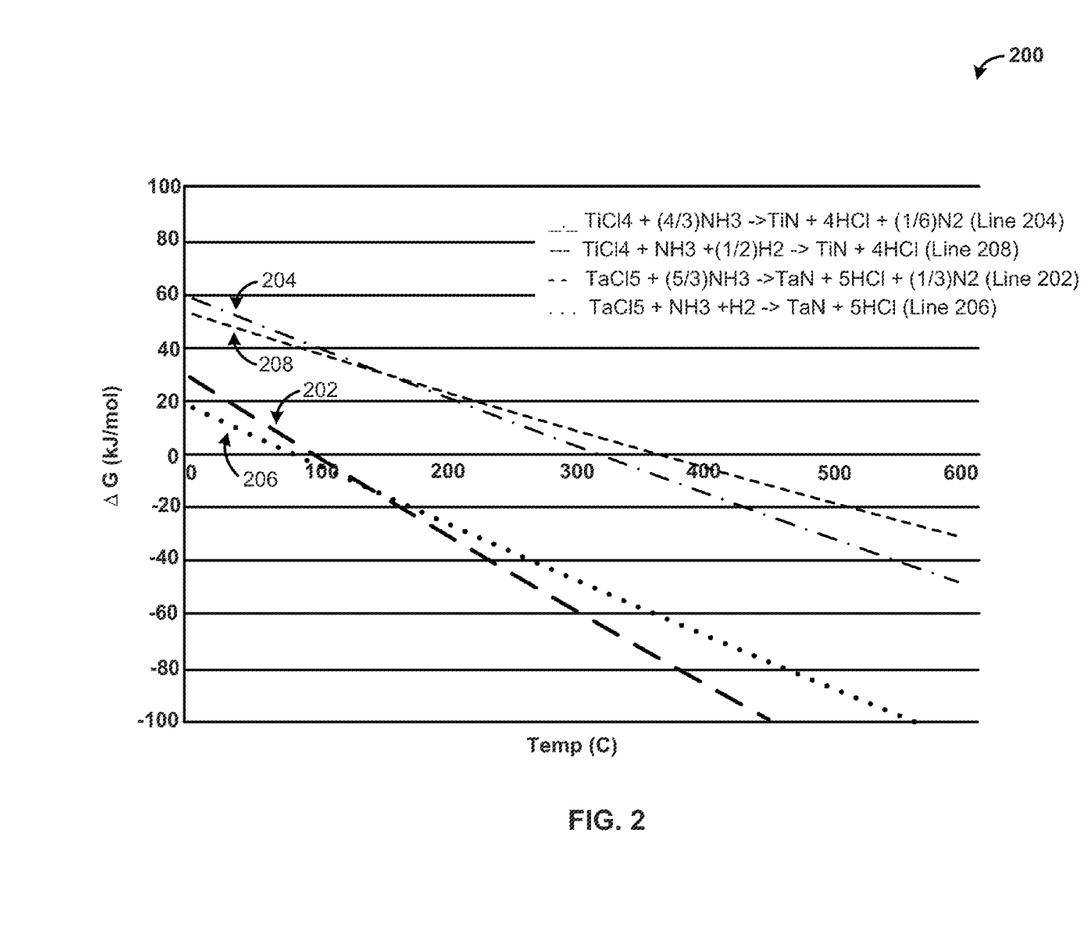
FIG. 2 illustrates Gibbs free energy relationships with temperature for nitrogen-containing films formed in accordance with exemplary embodiments of the present disclosure.

FIG. 2 schematically shows a comparison 200 between Gibb's free energy for TiN and TaN deposition processes. As shown in comparison 200, the formation of TaN from a reaction of $TaCl_5$ with $NH_3$ (shown by relationship 202) is believed to be thermodynamically favorable at temperatures of at least 100° C., while relationship 204 indicates that the formation of TiN from the reaction of $TiCl_4$ with $NH_3$ is believed to be thermodynamically favorable at a temperature of at least about 310° C. Accordingly, in some embodiments, it may be possible to form a solid solution of $Ta_xTi_{(1-x)}N$ or $Ti_{2x}Ta_{(2-x)}N$ at temperatures of 310° C. and above.

Moreover, in some embodiments, supplying a treatment gas may increase conversion of some metal-containing precursors into a respective metal compound (e.g., a metal nitride) and decrease the conversion of others. Without wishing to be bound by theory, the presence of a suitable treatment gas may facilitate desorption of ligands dissociated from the chemisorbed precursor and/or may facilitate changes in oxidation state of metal cations included in the lattice by creating lattice vacancies and/or scavenging surface-adsorbed oxygen and/or water molecules. This may offer a potential approach for adjusting the composition of a solid solution.

For example, relationship 206 shows that supplying hydrogen as a treatment gas may decrease the temperature at which formation of TaN is believed to be thermodynamically favorable to about 80° C., while hydrogen may increase the temperature at which formation of TiN is believed to be favorable to about 360° C., as shown in relationship 208. Therefore, if hydrogen is supplied as a treatment gas, it may be possible to form a different solid solution (e.g., having a composition of $Ta_yTi_{(1-y)}N$) at temperatures of above 360° C. and below 1100° C., a temperature at which hydrogen is believed to reduce $TaCl_5$ to Ta.

Figure 3:
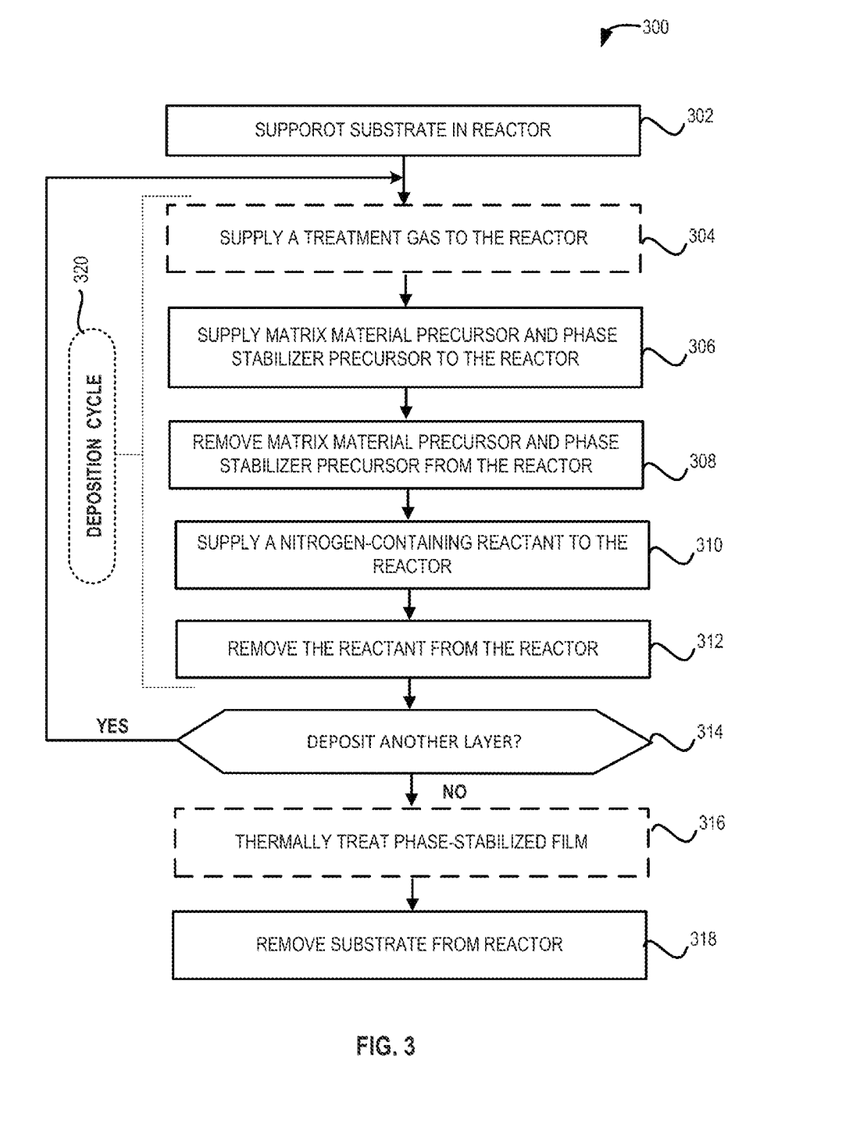
FIG. 3 illustrates a method of depositing a nitrogen-containing film according to exemplary embodiments of the present disclosure.

FIG. 3 illustrates a flowchart for an exemplary method 300 of forming a phase-stabilized nitrogen-containing film (also referred to herein as a layer) on a substrate. Method 300 may be performed by any suitable hardware and software, including the hardware and software described herein. It will be appreciated that portions of the processes described in method 300 may be omitted, reordered, and/or supplemented without departing from the scope of the present disclosure.

At 302, method 300 includes supporting a substrate in a reactor. A phase-stabilized film may be formed on an exposed surface of any suitable substrate without departing from the present disclosure. Further, the substrate may have any suitable topography, including planar and non-planar surfaces that are exposed for deposition, and the substrate may include layers of various materials, such as materials used to form semiconductor devices.

In some embodiments, the phase-stabilized layer may be formed on top of a nucleation layer provided on the substrate surface. The nucleation layer may help physically align atoms during the deposition process, potentially acting as a physical template that provides some physical stabilization for the phase-stabilized film during the initial deposition of the film. Put another way, as the various atoms forming the initial layers of the phase-stabilized film are deposited on the nucleation layer, such atoms may conform to the morphology of the underlying nucleation layer.

It will be appreciated that the material selected for the nucleation layer may vary depending on the phase-stabilized film to be deposited thereon. For example, the nucleation layer may be selected to have lattice parameters that are acceptably similar to lattice parameters for the selected solid phase of the phase-stabilized film—e.g., within about 2.3% of each other. Further, it will be appreciated that other parameters for the nucleation layer may be selected according to the application for the phase-stabilized film. An example of such an application is described below with reference to FIG. 5.

In cases where a nucleation layer is provided on the substrate, the nucleation layer may be formed in the same reactor prior to forming the phase-stabilized film. In some other embodiments, the nucleation layer may be formed in a common process tool with the reactor, so that the substrate does not experience a vacuum break and/or is not exposed to an ambient atmosphere prior to forming the phase-stabilized film in the reactor.

In accordance with some embodiments, supporting the substrate in the reactor step 302 may include adjusting one or more reactor conditions, such as temperature, pressure, and/or inert gas (e.g., argon (Ar), nitrogen ($N_2$), or helium (He)) flow rate, to conditions suitable for film formation prior to processing the substrate. It will be appreciated that such film formation conditions may vary according to film deposition process chemistry, substrate surface termination, and the like.

For example, reactor conditions may be adjusted to facilitate the formation of surface-active species from suitable film precursors by activating surface adsorption and decomposition processes. Reactor conditions may also be adjusted to facilitate film formation by activating the reaction of such surface-active species with a suitable reactant, whether present in the gas phase or on the surface. In some scenarios, reactor conditions may be adjusted to avoid gas phase decomposition reactions for one or more of precursors and/or reactants, potentially avoiding film contamination from decomposition products and/or poor step coverage resulting from diffusion effects. Further, in some scenarios, reactor conditions may be adjusted to avoid condensation of precursors and/or reactants on various reactor surfaces, potentially avoiding small particle defect generation processes.

For example, non-limiting reactor temperatures for depositing a phase-stabilized film of $Ta_xTi_{(1-x)}N$ include temperatures between 310° C. and 600° C. in some scenarios and between 450° C. and 600° C. in some other scenarios. Non-limiting reactor pressures for such films include pressures between 0.5 Torr and 10 Torr.

Exemplary method 300 enters a deposition cycle after supporting the substrate in the reactor at 302. As used herein, a deposition cycle refers to a film deposition including a single exposure (e.g., a pulse) of the matrix material and the phase stabilizer precursors and a single exposure of a nitrogen-containing reactant. It will be appreciated that any suitable adjustments to the reactor conditions may be made during the deposition cycle, including adjustments to temperature, pressure, and/or the flow rates of various gases supplied to the reactor during the deposition cycle.

An exemplary deposition cycle 320 includes optional process 304 and processes 306 through 312. It will be appreciated that the arrangement and order of processes shown in the deposition cycle depicted in FIG. 3 are provided for illustrative purposes only, and may be varied in any suitable way in some embodiments.

Method 300 may include, optional step 304 of supplying a treatment gas to the reactor. Supplying a treatment gas may facilitate deposition-related surface reactions (e.g., byproduct desorption reactions and precursor ligand desorption reactions) that may enhance deposition rate of the phase-stabilized film. Additionally or alternatively, supplying a treatment gas may facilitate the formation of selected oxidation states of one or more kinds of metal cations included in the film lattice. In turn, the formation of the selected oxidation states may lead to the formation of a selected composition associated with the phase-stabilized film.

It will be appreciated that any suitable treatment gas may be supplied to the reactor. One non-limiting example treatment gas includes hydrogen. Further, it will be appreciated that, if provided, the treatment gas may be supplied during any suitable portion during the deposition of the phase-stabilized film. For example, a treatment gas may be supplied during an entire deposition cycle configured to deposit a layer of phase-stabilized film. Or, a treatment gas may be supplied during less than an entire deposition cycle, such as during a precursor supply portion of a deposition cycle or during a reactant supply portion of a deposition cycle.

At 306, method 300 includes supplying a matrix material precursor and a phase stabilizer precursor to the reactor during a precursor supply portion of the deposition cycle. The matrix material precursor and a phase stabilizer precursor may be supplied to a reaction chamber simultaneously/concurrently or sequentially—e.g., in separate pulses. Any suitable (e.g., thermally-activated) matrix material precursor and phase stabilizer precursor may be employed without departing from the scope of the present disclosure. For example, in some embodiments, the matrix material precursor and/or the phase stabilizer precursor may comprise various organo-substituted metal compounds and/or halo-substituted metal compounds, which may be employed depending on the particular deposition chemistry that is contemplated. In one non-limiting example, a phase-stabilized film of $Ta_xTi_{(1-x)}N$ may be formed from a metal nitride precursor that includes $TaCl_5$ and a phase stabilizer precursor that includes $TiCl_4$.

It will be appreciated that the amount of each precursor supplied to the reactor during process 306 may vary according to, among other factors, the topography of the exposed surface of the substrate, the film formation conditions present in the reactor, and the competitive adsorption rates and/or the sticking coefficients of each of the precursors on the surface under those conditions. In one non-limiting process for depositing a phase-stabilized film of $Ta_xTi_{(1-x)}N$, $TaCl_5$ and $TiCl_4$ may be supplied to the reactor in concurrent or sequential pulses having durations of between 50 msec and 1 sec each.

Without wishing to be bound by theory, as the matrix material precursor and phase stabilization precursor are supplied to the reactor, gas phase molecules of those precursors may adsorb on the exposed surface of the substrate. Some of the gas phase molecules may become chemically adsorbed (e.g., chemisorbed) to the surface at sites on the surface that activate such chemisorption reactions. Such chemisorbed species form surface-active species of their respective precursors. Because a surface-active species may be bound to at least one surface site until a further reaction occurs, adsorption of the precursors may occur in a self-limiting manner. In turn, the film deposited during a deposition cycle may be moderated by the surface reactions of these active species with a subsequently-supplied reactant, as described in more detail below.

In some embodiments, a full monolayer may be deposited in each deposition cycle 320. In some other embodiments, less than a full monolayer may be deposited in each deposition cycle. For example, in a non-limiting process for depositing a phase-stabilized film of $Ta_xTi_{(1-x)}N$, each deposition cycle may deposit approximately ⅓ Å of film, so that 3-4 deposition cycles result in approximately 1 monolayer of film.

It will be appreciated that relative amounts of the respective precursors may be supplied to the reactor according to any suitable technique. Non-limiting examples include controlling mass or volume flows of vapor or liquid precursor sources using suitable valves, flow controllers, pressure controllers, and so on. Other examples include, but are not limited to, controlling precursor supply via a phase change from one state to another, such as by controlling temperatures and/or pressures of liquid or solid precursor sources.

In some embodiments, the matrix material and phase stabilizer precursors may be supplied via a common delivery line coupled to sources for each of the precursors, so that there is a simultaneous supply of the matrix material precursor during any supply of the phase stabilizer precursor, within an acceptable tolerance.

In some other embodiments, the matrix material and phase stabilizer precursors may be supplied to the reactor via separate delivery lines. In some of such embodiments, concurrent supply of the precursors may include overlapping a pulse of one precursor with at least a portion of a pulse of the other precursor. This may provide a selected population of surface-active species derived from a particular precursor that is potentially different from an equilibrium surface population that might ordinarily result from differences in competitive adsorption rates for the precursors.

At 308, method 300 includes removing the matrix material precursor and the phase stabilizer precursor from the reactor. Removing the matrix material precursor and the phase stabilizer precursor from the reactor includes removing gas phase molecules of the precursors and molecules of the precursors that are condensed on the surface but that are not chemically adsorbed to it. Such physically adsorbed (e.g., physisorbed) molecules may be condensed on the surface in more than one layer or may be distributed in non-uniform ways (such as being condensed within narrow openings formed in the exposed surface). Removing non-chemisorbed precursor molecules may prevent reaction of such molecules with a subsequently-introduced oxygen-containing reactant. In turn, it may be possible that non-uniform, non-conformal film formation and/or small particle defect generation that may result from residual, non-chemisorbed molecules of the precursor may be avoided. Although illustrated as a single step 308, if matrix material precursor and phase stabilizer precursor are separately pulsed to a reaction chamber, the respective precursor may be removed prior to a pulse of the next precursor.

It will be appreciated that any suitable approach for removing residual matrix material precursor and the phase stabilizer precursor from the reactor may be employed without departing from the scope of the present disclosure. For example, in some embodiments, the reactor may be evacuated to a base pressure for a time suitable to remove the residual precursor. Additionally or alternatively, in some embodiments, the reactor may be supplied with a suitable displacement gas, such as Ar, $N_2$, or He for a suitable time.

At 310, method 300 includes supplying a nitrogen-containing reactant to the reactor. Without wishing to be bound by theory, the nitrogen-containing reactant may be thermally activated to form gas-phase activated species and/or surface-adsorbed activated species. Such activated species may react with active species formed from the matrix material precursor and/or the phase stabilizer precursor on the exposed surface of the substrate to form the phase-stabilized film. Because the population of surface active species may moderate the film deposition rate, the reaction between the surface active species and the activated species formed from the reactant may be comparatively fast, potentially avoiding thickness non-uniformity that might otherwise result from mass transport effects. Although illustrated as a separate step 310, a nitrogen-containing reactant (e.g., $N_2$) may be continuously fed to a reactor and submitted to a plasma pulse to activate the reactant—i.e., form activated species, such as nitrogen ions and/or radicals. Or, if the nitrogen-containing reactant is thermally activated (e.g., ammonia ($NH_3$) or hydrazine ($N_2H_4$)) and allowed to continuously flow during the deposition cycle, chemical vapor deposition of the nitrogen-containing film may result—rather than atomic layer deposition of the film.

Any suitable thermally-activated nitrogen-containing reactant may be employed without departing from the scope of the present disclosure. Non-limiting examples of nitrogen-containing reactants that may be used in a process for depositing a phase-stabilized film of $Ta_xTi_{(1-x)}N$ include ammonia ($NH_3$) and hydrazine ($N_2H_4$).

At 312, method 300 includes removing the nitrogen-containing reactant from the reactor. Removing the nitrogen-containing reactant from the reactor includes removing gas phase molecules and surface-adsorbed nitrogen-containing reactant. Removing residual nitrogen-containing reactant may prevent unwanted gas phase or surface reactions when the matrix material precursor and the phase stabilizer precursor are introduced to the reactor during a subsequent layer formation cycle. In turn, it may be possible that non-uniform, non-conformal film formation and/or small particle defect generation that may result from reaction between residual nitrogen-containing reactant molecules and the precursors may be avoided.

It will be appreciated that any suitable approach for removing residual nitrogen-containing reactant from the reactor may be employed without departing from the scope of the present disclosure. For example, in some embodiments, the reactor may be evacuated to a base pressure for a time suitable to remove the residual nitrogen-containing reactant. Additionally or alternatively, in some embodiments, the reactor may be supplied with a suitable displacement gas, such as Ar, $N_2$, or He for a suitable time. It will be appreciated that, in some embodiments, processes for removing residual nitrogen-containing reactant may vary from processes for removing the precursors. For example, the reactant may have a comparatively greater sticking coefficient relative to the precursor(s). Accordingly, the reactor may be purged and/or evacuated for a longer time at 312 relative to 308.

As introduced above, in some embodiments, a single deposition cycle of processes 304 through 312 may result in a consistent thickness of film formed from a self-limiting adsorption and reaction process. Consequently, in some of such embodiments, any suitable thickness of phase-stabilized film may be formed by repeating the deposition cycle a suitable number of times. Thus, method 300 includes, at 314, determining whether to deposit another layer of phase-stabilized film. If another layer is to be deposited, method 300 returns to 304; if not, method 300 continues. In some embodiments, the reactor conditions under which the phase-stabilized film is formed may cause diffusion among individually deposited layers (e.g., within layers deposited during a particular deposition cycle) and between such layers. Such diffusion processes may help mobilize the phase stabilizer so that the phase-stabilized film exhibits the selected solid phase. Such processes may be supplemented with one or more additional thermal treatments, which may include annealing the film at an elevated temperature and/or varying a temperature of the film over time according to a preselected thermal treatment program. Accordingly, thermally treating the film may provide an additional approach for stabilizing the film at the selected solid phase and/or adjusting various physical characteristics of the film (e.g., grain size). Further, thermally treating the film may assist with the removal of one or more film contaminants. For example, thermal treatment may reduce concentrations of carbon and/or halogens introduced by precursor ligands.

In some embodiments, thermal treatment may include treatment with a suitable treatment gas, such as hydrogen, while in some other embodiments, thermal treatment may occur while the reactor is evacuated (e.g., at a base vacuum level) or controlled to a preselected pressure with a suitable inert gas, such as argon, helium, and/or nitrogen.

As an example of such thermal treatments, method 300 includes, at 316, thermally treating the phase-stabilized film. However, it will be appreciated that such treatments may be included at any suitable interval during film deposition in some embodiments. Once film deposition and, if included, thermal treatment, is complete, the substrate is removed from the reactor at 318.

Figure 4:
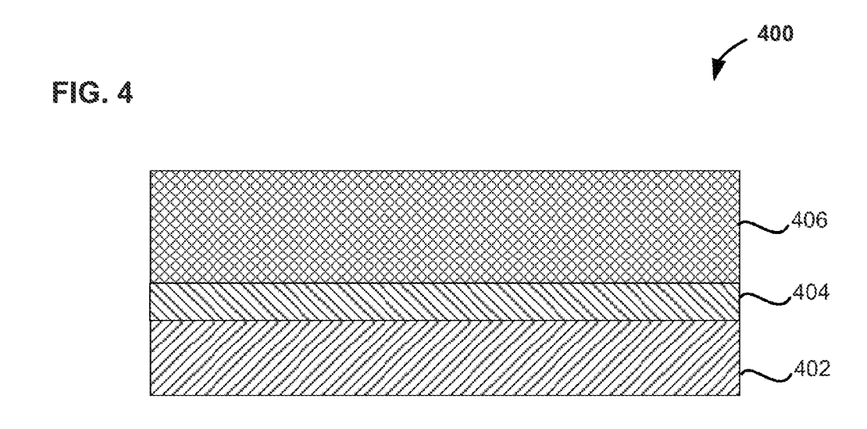
FIG. 4 illustrates a semiconductor structure according to additional exemplary embodiments of the present disclosure.

FIG. 4 schematically illustrates an exemplary film stack or structure 400 that includes a nitrogen-containing phase-stabilized film (e.g., $Ta_xTi_{(1-x)}N$) that may be formed according to the present disclosure. As illustrated in FIG. 4, film stack 400 includes a substrate 402, a gate dielectric layer 404, and a metal gate electrode layer 406 that comprises the phase-stabilized film. Substrate 402 may include any suitable substrate. One non-limiting example substrate includes a silicon (Si) substrate. Regardless of the type of substrate, it will be appreciated that the substrate may include various films and/or structures resulting from prior processing of the substrate. In the embodiment illustrated in FIG. 4, the surface of substrate 402 is planar. However, it will be appreciated that, in some other embodiments, the substrate surface may be non-planar. For example, the substrate surface may include a non-planar surface topography that may comprise one or more fins, troughs, vias, mesas, or other structures in any suitable density.

Gate dielectric layer 404 is formed on top substrate 402. Non-limiting example gate dielectric materials include silicon oxide ($SiO_2$) and hafnium oxide ($HfO_2$). Gate dielectric layer 404 may be grown from a top surface of substrate 402 (e.g., a layer of $SiO_2$ grown on top of a silicon substrate). Or, gate dielectric layer 404 may be deposited on a top surface of substrate 402. Where the surface of substrate 402 is non-planar, gate dielectric layer 404 may be a conformal layer over part of the surface of substrate 402; alternatively, gate dielectric layer 404 may be formed in a conformal layer over the entire surface of substrate 402.

Metal gate electrode layer 406 is formed on a top surface of gate dielectric layer 404. Metal gate electrode layer 406 includes one or more of the phase-stabilized films described herein, which may be formed according to the phase-stabilized film formation processes of the present disclosure.

Figure 5:
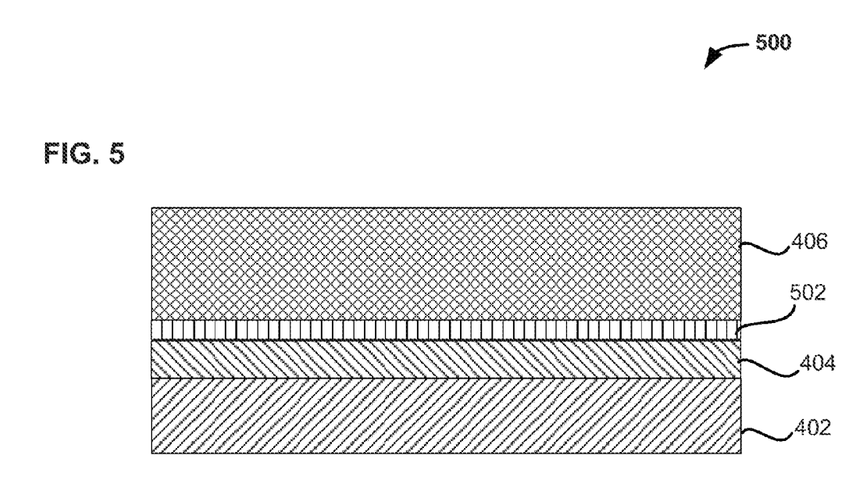
FIG. 5 illustrates a semiconductor structure according to yet additional exemplary embodiments of the present disclosure.

As introduced above, in some embodiments, the phase-stabilized layer may be formed on top of a nucleation layer. FIG. 5 schematically illustrates a film stack or structure 500 that includes a phase-stabilized film (e.g., $Ta_xTi_{(1-x)}N$) formed on top of a nucleation layer 502. As shown in FIG. 5, film stack 500 includes substrate 402 and gate dielectric layer 404. Metal gate electrode layer 406 comprising the phase-stabilized film is shown on top of a nucleation layer 502. It will be appreciated that nucleation layer 502 may be configured to be work function-transparent in some embodiments, so that the work function setting characteristics of metal gate electrode layer 406 may not be altered/masked.

Figure 6:
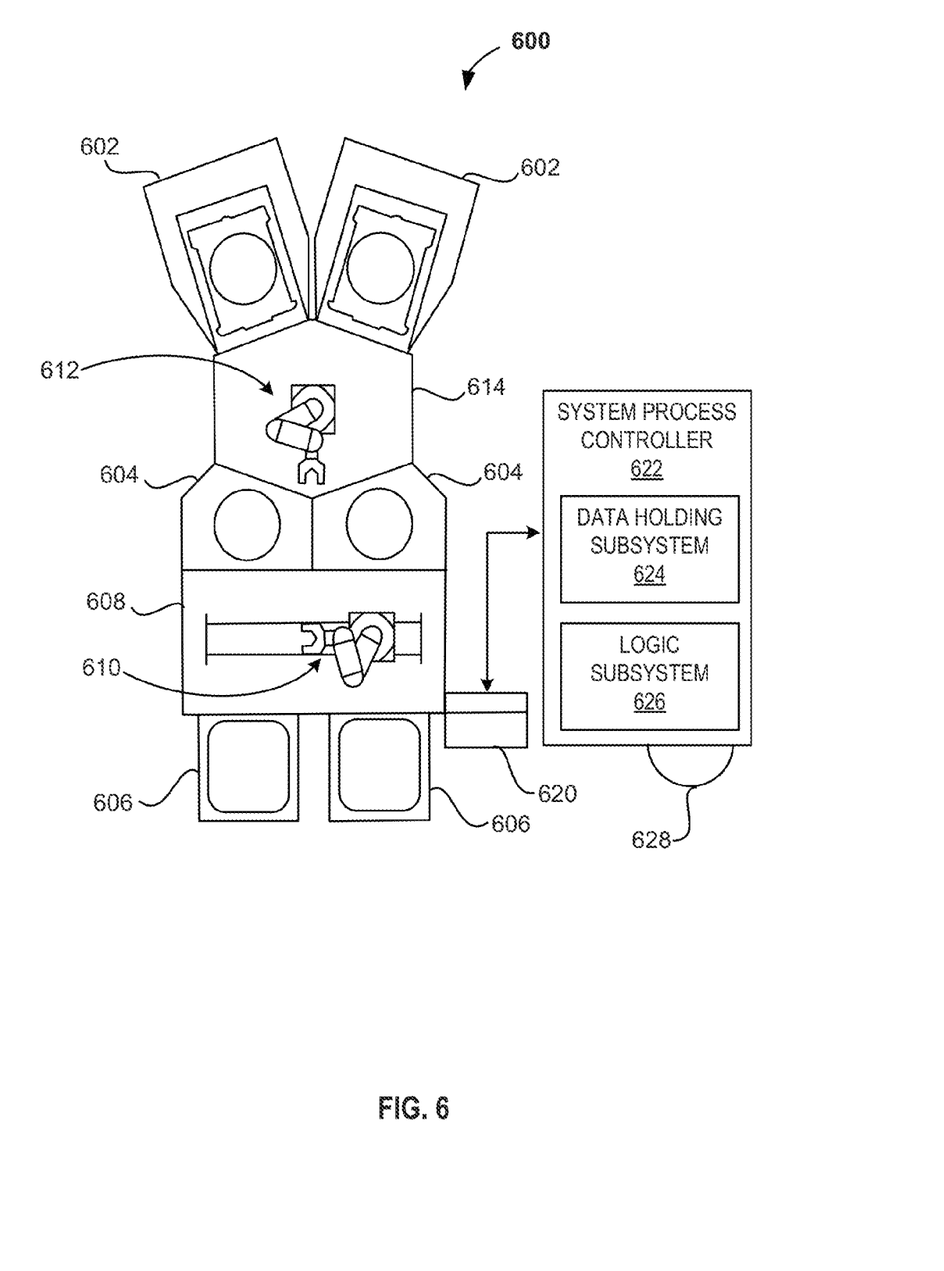
FIG. 6 illustrates a process tool suitable for forming phase-stabilized nitrogen-containing films in accordance with exemplary embodiments of the present disclosure.

In some embodiments, the phase-stabilized films described herein may be deposited using a suitable semiconductor processing tool. FIG. 6 schematically illustrates a top view of an exemplary semiconductor processing tool 600 including a plurality of semiconductor processing modules 602. While the depicted embodiment includes two modules, it will be appreciated that any suitable number of semiconductor processing modules may be provided. For example, some processing tools may include just one module while other processing tools may include more than two modules.

FIG. 6 also illustrates load locks 604 for moving substrates between portions of semiconductor processing tool 600 that exhibit ambient atmospheric pressure conditions and portions of the tool that are at pressures lower than atmospheric conditions. An atmospheric transfer module 608, including an atmospheric substrate handling robot 610, moves substrates between load ports 606 and load locks 604, where a portion of the ambient pressure is removed by a vacuum source (not shown) or is restored by backfilling with a suitable gas, depending on whether substrates are being transferred into or out of the tool. Low-pressure substrate handling robot 612 moves substrates between load locks 604 and semiconductor processing modules 602 within low-pressure transfer module 614. Substrates may also be moved among the semiconductor processing modules 602 within low-pressure transfer module 614 using low-pressure substrate handling robot 612, so that sequential and/or parallel processing of substrates may be performed without exposure to air and/or without a vacuum break.

FIG. 6 also shows a user interface 620 connected to a system process controller 622. User interface 620 is adapted to receive user input to system process controller 622. User interface 620 may optionally include a display subsystem, and suitable user input devices such as keyboards, mice, control pads, and/or touch screens, for example, that are not shown in FIG. 6.

FIG. 6 illustrates an exemplary system process controller 622 provided for controlling semiconductor processing tool 600. System process controller 622 may operate process module control subsystems, such as gas control subsystems, pressure control subsystems, temperature control subsystems, electrical control subsystems, and mechanical control subsystems. Such control subsystems may receive various signals provided by sensors, relays, and controllers and make suitable adjustments in response.

Exemplary system process controller 622 includes a computing system that includes a data-holding subsystem 624 and a logic subsystem 626. Data-holding subsystem 624 may include one or more physical, non-transitory, devices configured to hold data and/or instructions executable by logic subsystem 626 to implement the methods and processes described herein. Logic subsystem 626 may include one or more physical devices configured to execute one or more instructions stored in data-holding subsystem 624. Logic subsystem 626 may include one or more processors that are configured to execute software instructions.

In some embodiments, such instructions may control the execution of process recipes. Generally, a process recipe includes a sequential description of process parameters used to process a substrate, such parameters including, but not limited to, time, temperature, pressure, and concentration, as well as various parameters describing electrical, mechanical, and environmental aspects of the tool during substrate processing. The instructions may also control the execution of various maintenance recipes used during maintenance procedures.

In some embodiments, such instructions may be stored on removable computer-readable storage media 628, which may be used to store and/or transfer data and/or instructions executable to implement the methods and processes described herein, excluding a signal per se. It will be appreciated that any suitable removable computer-readable storage media 628 may be employed without departing from the scope of the present disclosure. Non-limiting examples include DVDs, CD-ROMs, floppy discs, and flash drives.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, performed in other sequences, or omitted in some cases.

The subject matter of the present disclosure includes all novel and nonobvious combinations and subcombinations of the various processes, systems and configurations, and other features, functions, acts, and/or properties disclosed herein, as well as any and all equivalents thereof.

We claim:

1. A cyclic deposition method of forming a phase-stabilized nitrogen-containing film comprising a solid solution having a stoichiometric ratio of $Mm_{zx}Ms_{(z-x)}X$, where $Mm_{zx}$ and $Ms_{(z-x)}$ are transition metals, one belonging to Group V, another belonging either to Group IV or to Group VI of Periodic Table, x varies in a range from greater than 0 to less than 1 and z varies in a range from greater than x to 1, wherein the phase-stabilized nitrogen-containing film comprises a matrix material and a phase stabilizer within the solid solution, wherein the phase-stabilized nitrogen-containing film is formed on a substrate within a reactor by exposing the substrate to a pulse of a matrix material precursor and a phase stabilizer precursor, removing an unreacted matrix material precursor and an unreacted phase stabilizer precursor from the reactor, exposing the substrate to a pulse of a nitrogen-containing reactant, and removing an unreacted nitrogen-containing reactant from the reactor, and wherein the phase stabilizer stabilizes the matrix material in a solution phase that is different from a native phase of the matrix material that would be formed under identical film formation conditions.

2. The cyclic deposition method of forming the phase-stabilized nitrogen-containing film of claim 1, wherein the matrix material comprises a metal nitride.

3. The cyclic deposition method of forming the phase-stabilized nitrogen-containing film of claim 1, wherein the matrix material comprises a metal nitride with Group V transition metal.

4. The cyclic deposition method of forming the phase-stabilized nitrogen-containing film of claim 1, wherein the phase stabilizer comprises one or more transition metals selected from the Group IV or from Group VI.

5. The cyclic deposition method of forming the phase-stabilized nitrogen-containing film of claim 1, wherein $Mm_{zx}Ms_{(z-x)}X$ comprises $Ta_xTi_{(1-x)}N$.

6. The cyclic deposition method of forming the phase-stabilized nitrogen-containing film of claim 1, wherein the matrix material determines one or more electrical properties of the phase-stabilized nitrogen-containing film.

7. The cyclic deposition method of forming the phase-stabilized nitrogen-containing film of claim 1, wherein the matrix material determines a work function of the phase-stabilized nitrogen-containing film.

8. The cyclic deposition method of forming the phase-stabilized nitrogen-containing film of claim 1, wherein the phase stabilizer affects morphological characteristics of the phase-stabilized nitrogen-containing film.

9. A method of forming a semiconductor structure, comprising a gate dielectric material and a gate electrode overlying the gate dielectric material, wherein the gate electrode comprising a solid solution having a stoichiometric ratio of $Mm_{zx}Ms_{(z-x)}X$, where $Mm_{zx}$ and $Ms_{(z-x)}$ are transition metals, one belonging to Group V, another belonging either to Group IV or Group VI of Periodic Table, x varies in a range from greater than 0 to less than 1 and z varies in a range from greater than x to 1, the solid solution comprising a phase stabilizer that stabilizes a metal nitride in a solution phase that is different from a native phase of the metal nitride that would be formed under identical formation conditions, wherein the solid solution is formed on a substrate within a reactor via a cyclic deposition process by exposing the substrate to a pulse of a matrix material precursor and a phase stabilizer precursor, removing an unreacted matrix material precursor and an unreacted phase stabilizer precursor from the reactor, exposing the substrate to a pulse of a nitrogen-containing reactant, and removing an unreacted nitrogen-containing reactant from the reactor.

10. The method of forming the semiconductor structure of claim 9, wherein the metal nitride comprises one or more transition metals selected from Group V of Periodic Table.

11. The method of forming the semiconductor structure of claim 9, wherein the phase stabilizer comprises one or more transition metals selected from Group IV or from Group VI of Periodic Table.

* * * * *